(12) United States Patent
Teo et al.

(10) Patent No.: US 7,569,474 B2
(45) Date of Patent: Aug. 4, 2009

(54) METHOD AND APPARATUS FOR SOLDERING MODULES TO SUBSTRATES

(75) Inventors: Keng Lee Teo, Singapore (SG); Wey Ngee Desmond Chin, Singapore (SG)

(73) Assignee: Infineon Technologies AG, Munich (DE)

( * ) Notice: Subject to any disclaimer, the term of this patent is extended or adjusted under 35 U.S.C. 154(b) by 228 days.

(21) Appl. No.: 11/483,015

(22) Filed: Jul. 7, 2006

(65) Prior Publication Data

US 2006/0249855 A1 Nov. 9, 2006

Related U.S. Application Data

(63) Continuation of application No. PCT/SG2004/000007, filed on Jan. 7, 2004.

(51) Int. Cl.
*H01L 21/00* (2006.01)
*H01L 21/44* (2006.01)

(52) U.S. Cl. .................. 438/616; 438/118; 438/612; 438/613; 438/315

(58) Field of Classification Search ......... 438/118–119, 438/616, 612
See application file for complete search history.

(56) References Cited

U.S. PATENT DOCUMENTS

| | | | |
|---|---|---|---|
| 4,712,721 A | 12/1987 | Noel et al. | |
| 5,323,947 A | 6/1994 | Juskey et al. | |
| 5,626,278 A | 5/1997 | Tang | |
| 5,751,068 A | 5/1998 | McMahon et al. | |
| 6,253,675 B1 | 7/2001 | Mayer | |
| 6,426,564 B1 | 7/2002 | Ball | |
| 2001/0000905 A1 | 5/2001 | Davis et al. | |
| 2002/0185713 A1 | 12/2002 | Nakae | |
| 2002/0192936 A1* | 12/2002 | Ball ........................ | 438/613 |
| 2005/0056946 A1* | 3/2005 | Gilleo ..................... | 257/783 |

* cited by examiner

*Primary Examiner*—Ha Tran T Nguyen
*Assistant Examiner*—Valerie Brown
(74) *Attorney, Agent, or Firm*—Slater & Matsil, L.L.P.

(57) ABSTRACT

A method and apparatus for attaching a module such as a semiconductor device, having an array of contacts arranged thereon in a given pattern to a substrate such as a printed circuit board comprises applying an array of solder blocks to the array of contacts on the module. The module is then positioned on the substrate so that the array of solder blocks contacts the array of contact pads on the substrate. Heat is then applied to reflow the solder blocks to provide mechanical and electrical connection of the module to the substrate.

12 Claims, 4 Drawing Sheets

METHOD AND APPARATUS FOR SOLDERING MODULES TO SUBSTRATES

This application is a continuation of co-pending International Application No. PCT/SG2004/000007, filed Jan. 7, 2004, which designated the United States and was published in English, which application is incorporated herein by reference.

TECHNICAL FIELD

The present invention relates to a method and apparatus for attaching a module such as a semiconductor device, to a substrate such as a printed circuit board.

BACKGROUND

Conventional processes for the assembly rework of surface mount technology (SMT) boards typically comprise removal of the components and cleaning of the sites. To fix the replacement components to the boards, one or more flat mini-metal stencils are applied to the boards to define the solder pattern to be applied. Solder paste is then applied to the solder pads on boards and is forced through the apertures in the stencil(s) using a squeegee. The one or more stencils are then removed. The semiconductor device is then positioned on the board and fixed thereto by reflow soldering of the solder paste.

The flat mini-metal stencil is custom-sized to fit into the reworked space within the confines of surrounding components. The mini-metal stencil may be formed with sides and other features that allow for manual mechanical fixturing for alignment to the printed circuit board (PCB) pattern. However, these mini-metal stencils lack the mechanical support of the rigid stencil frame, as well as the automated functions of alignment, contact pressure, squeegeeing and stencil lift off that make the use of metal stencils successful in the primary SMT printing function.

In such conventional processes, the flat mini-metal stencil is positioned by manual alignment and is taped along the stencil's edges to the PCB. Alternatively, the formed mini-metal stencil may be aligned with a mechanical arm, which is required to be set-up for each component location. Both of these methods can result in insufficient mechanical retention between the stencil and PCB surface. Other problems with such conventional processes are that the stencil position may shift during squeegee passes, and the stencil may need to be removed and the board require cleaning and re-stencilling. Furthermore, alignment and positioning are typically difficult in such processes. Also, mini-metal stencils must be cleaned thoroughly between each use.

Further difficulties with the mini-metal stencil method include the possibility of not having enough solder paste deposited to form the contact pad or of having solder paste bleed under the stencil.

As the stencil is made of metal, it is not easy to tailor the stencil to fit the reworked site, which is typically a confined spaced between other semiconductor devices. As a result, the use of the mini-metal stencils requires a high level of skill to ensure that the correct amount of solder paste is deposited with only a single pass of the squeegee.

An alternative conventional method is to use a mini-metal stencil to apply the paste to the semiconductor device contacts and the thermal pads on the semiconductor device, rather than to apply the stencil to the land of the printed circuit board as described above. Similar difficulties arise in this alternative method, as are mentioned above.

A number of the above-mentioned problems with prior art systems are addressed in U.S. Pat. No. 6,253,675 issued to Mayer (the '675 patent), which describes a solder paste stencil printing apparatus and method. The stencil is a disposable, adhesive-backed, flexible, polymer membrane rather than being formed of metal. The stencil adheres to the PCB whilst the solder paste is applied thereto and squeegeed across the stencil surface. The stencil is then removed and the semiconductor device is located manually on the solder paste. A reflow process is applied to melt the solder and fix the semiconductor device to the PCB.

Although the device and methods described in the '675 patent address some disadvantages associated with conventional techniques using metal stencils, such as fixing the stencil to the PCB during the squeegee passes to prevent relative movement and inhibiting the solder paste from seeping under the stencil, the systems and devices described in this patent may still suffer from a number of disadvantages. For example, the alignment and positioning problems described above in connection with metal stencil techniques still exist, as well as the possibility of damage during stencil removal. Furthermore, a high level of skill is still required to ensure that the correct amount of solder paste is deposited with only a single pass of the squeegee.

U.S. Patent Application Publication No. 2001/0000905 A1 (the '905 publication) describes a system for ball grid arrays in which the conventional stencil is replaced with a preformed alignment device having a pattern of holes therethrough that may be aligned with the pattern or footprint of the ball grid array. The holes are filled with either solder paste, a curable conductive adhesive, or solid solder.

In use, the preform described in the '905 publication is attached to a PCB and the semiconductor is then placed above the preform so that the preform is interposed between the semiconductor being placed on the PCB and the PCB, with the material in the filled holes being in contact with the solder balls on the semiconductor device and the contact pads on the PCB. Heat is applied to reflow the solder or cure the adhesive in the holes to join the semiconductor device to the PCB. The preform may be left in place on the PCB thereby eliminating the possibility of damage that may occur in other conventional systems where the stencil is removed. Alternatively, if it is desired to remove the preform, a suitable material that can be dissolved away after the reflow process is used to form the preform. However, the alignment problems described above in connection with metal stencil techniques still remain.

In view of the foregoing problems with conventional processes and devices, a need exists for a quick and an easily applied method for replacing individual leadless semiconductor devices, such as QFN devices.

SUMMARY OF THE INVENTION

In general, the invention relates to an apparatus and method for attaching a module having an array of contacts arranged thereon in a given pattern to a substrate having an array of contact pads, comprising applying an array of solder blocks to the module and attaching the module to the substrate.

According to a first aspect of the present invention, a method is provided for attaching a module having an array of contacts arranged thereon in a given pattern to a substrate having an array of contact pads. An array of solder blocks is applied to the array of contacts on the module. The module is positioned on the substrate so that the array of solder blocks contacts the array of contact pads on the substrate. Heat is applied to reflow the solder blocks to provide mechanical and electrical connection of the module to the substrate.

According to a second aspect of the present invention a method attaches a semiconductor device, such as a Quad Flatpack Nonlead (QFN) device, having an array of contacts arranged thereon in a given pattern to a printed circuit board having an array of contact pads. Steps similar to those described above can be used.

According to a third aspect of the invention, a device can be used to attach a module having an array of contacts arranged thereon in a given pattern to a substrate having an array of contact pads. This device includes a removable carrier and an array of solder blocks arranged in an aperture in the carrier. The aperture is arranged to receive and align the module to align the array of contacts thereon with the array of solder blocks. The array of solder blocks is arranged to contact the array of contact pads on the substrate after removal of the removable carrier.

According to a fourth aspect of the present invention, a sheet includes an array of devices of the type defined above. Each of the devices in the array is removable from the sheet.

The invention thereby proposes an alternative method to the conventional solder paste printing with mini-stencils.

The methods and devices of the present invention are particularly advantageous over the prior art systems and methods that tend to suffer from problems with paste thickness and volume consistency, and alignment problems. In embodiments of the present invention, no stencil tooling is required and therefore less skill is required in implementing the process. Furthermore, the reworking of highly populated PCBs is easily achieved. Also, the solder deposition step takes less time than conventional stencil printing techniques, thereby improving rework efficiency.

BRIEF DESCRIPTION OF THE DRAWINGS

The present invention will now be described by way of example and with reference to the accompanying drawings in which:

FIG. 3b is a plan view of the carrier of FIG. 2 with the top cover removed to show an alternative solder block array to that shown in FIG. 3a;

DETAILED DESCRIPTION OF ILLUSTRATIVE EMBODIMENTS

A solder block array 1 formed according to an embodiment of the invention is shown FIGS. 1, 2, 3a and 3b. The solder block array 1 is to be attached to a replacement device, for example a QFN device, which is to be fitted to a printed circuit board. The array 1 includes a number of solder blocks 2 mounted in a carrier 4 and laterally spaced from one another to form an array corresponding to the land pattern for the leads of the replacement device (not shown) and exposed thermal pads (not shown) on the replacement device. The top and bottom surfaces of the solder blocks 2 in the array 1 are each coated with a flux film layer 5, 6 that serves as an adhesive for the replacement device and the land of the printed circuit board.

Figure 1:
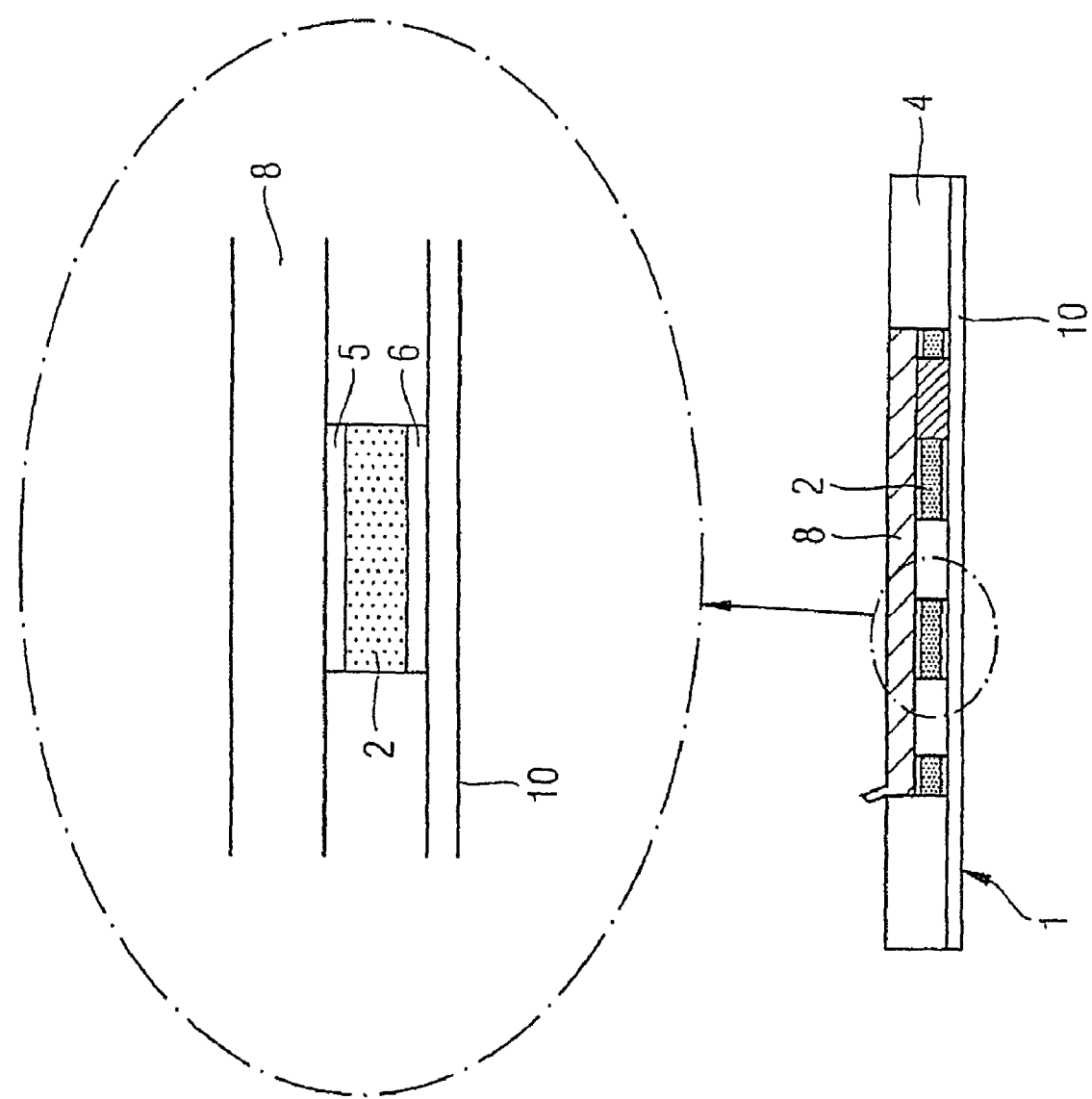
FIG. 1 is a sectional elevation of a solder block array according to an embodiment of the present invention.
Figure 2:
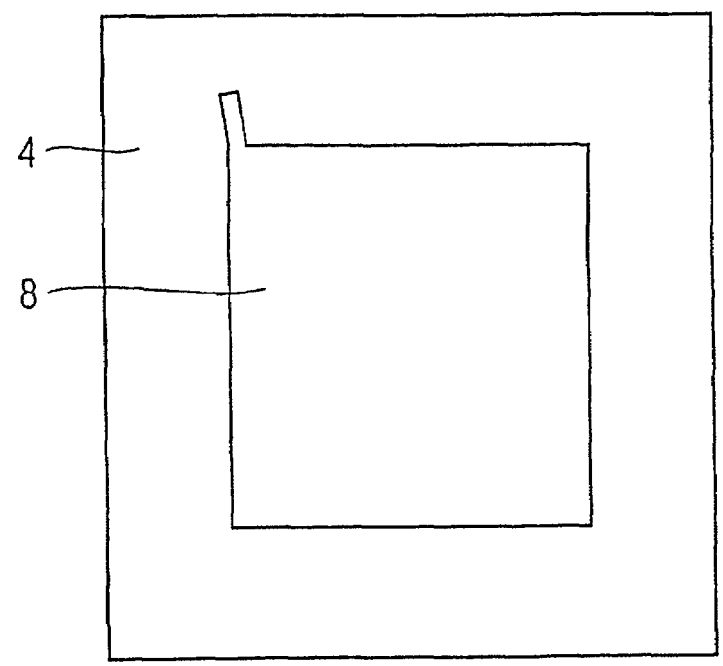
FIG. 2 is a plan view of a carrier containing the solder block array of FIG. 1.

The top surface of the carrier 4 is fitted with a detachable cover 8 which, as shown in FIG. 2, extends over the aperture in the carrier containing the array 1 of solder blocks 2. The top cover 8 may be formed, for example, of paper. The bottom surface of the carrier 4 is also fitted with a detachable cover 10 that could be formed, for example of a plastic or plastics material.

Figure 3A:
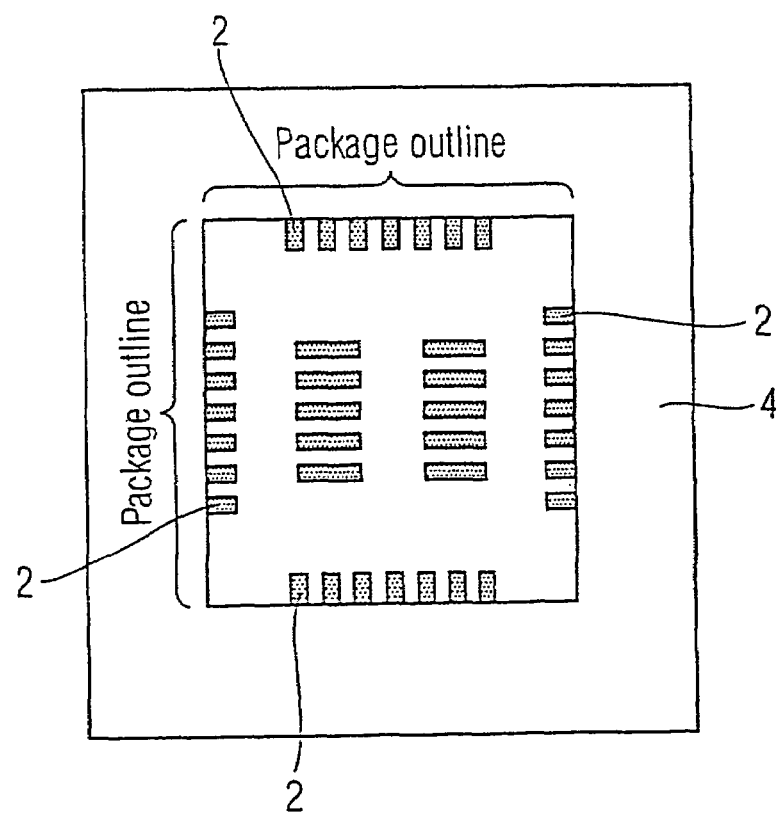
FIG. 3a is a plan view of the carrier of FIG. 2 with the top cover removed to show the solder block array of FIG. 1.
Figure 3B:
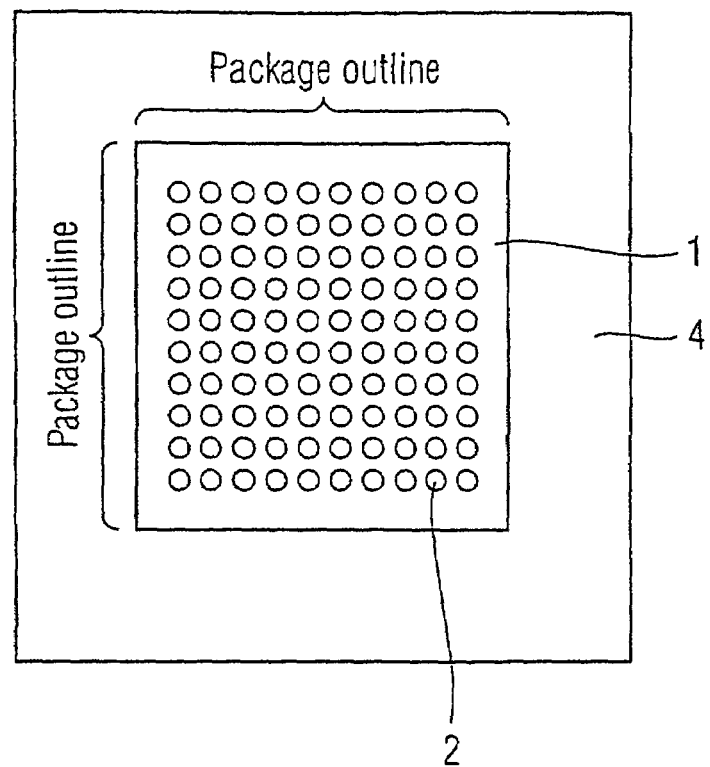

FIGS. 3a and 3b show alternative layouts for an array 1 of solder blocks 2. The layout and shape of the individual solder blocks will depend on the device for which the array is intended, for example, a QFN device may have an array of solder blocks such as that shown in FIG. 3a in which the solder blocks 2 are rectangular in cross-section. A ball grid array is shown in FIG. 3b where the solder blocks have a circular cross-section.

Figure 4:
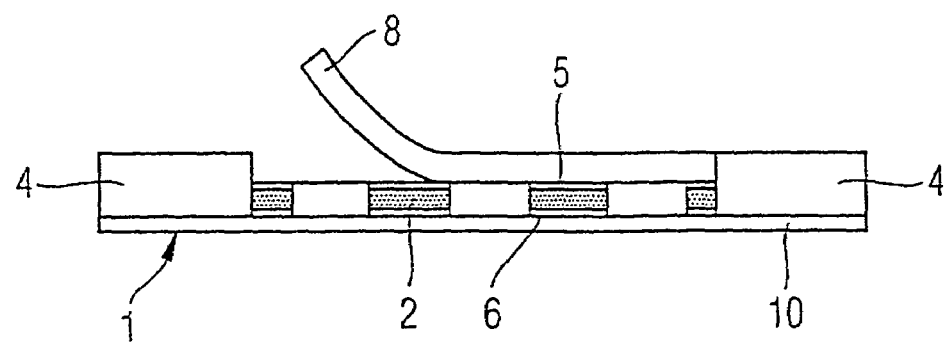
FIG. 4 is a partial sectional side elevation through the solder block of FIG. 1 with the top cover partially removed.

As shown in FIG. 4, the top cover 8 extending over the solder block array 1 mounted in the carrier 4, may be peeled back to reveal the array 1 of solder blocks 2, before applying the solder array 1 to the replacement device.

Figure 5:
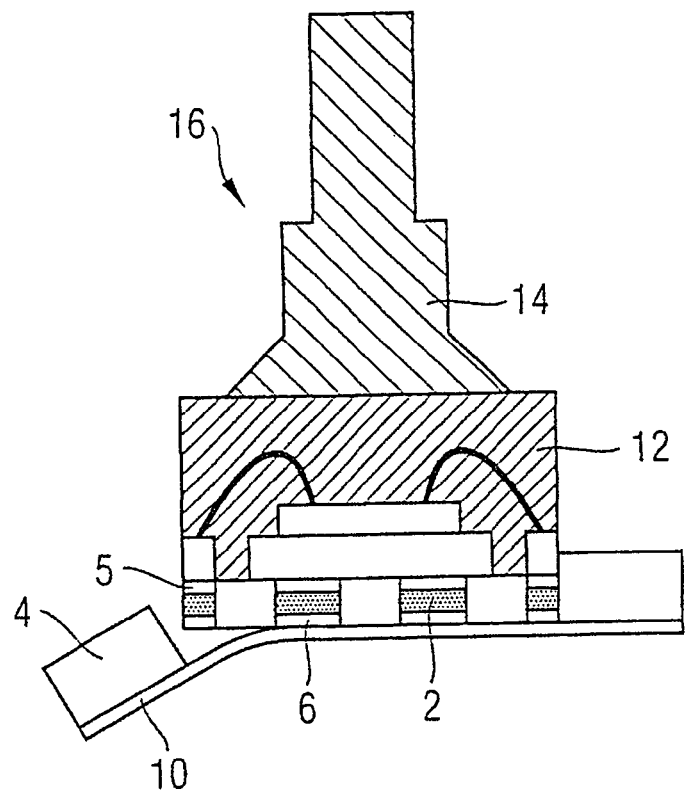
FIG. 5 is a side elevation of a solder block array according to an embodiment of the invention attached to a QFN device to be fitted to a board, with the bottom cover of the solder block array partially removed.

FIG. 5 shows a QFN device 12 held in a vacuum pick-up head 14 of a re-work system/machine 16. The solder block array 1 is applied to the base of the QFN device 12 and is held therein by the adhesive flux layer 5 on the top surface of the solder blocks 2. The carrier 4 is designed so that the QFN device 12 drops into the aperture in the carrier in which the array 1 of solder blocks 2 is located and the QFN device 12 is thereby aligned over the solder blocks 2. The carrier 4 and bottom cover 10 may be peeled off, as shown in FIG. 5, to allow the QFN device 12 with its solder blocks 2 to be positioned on a PCB (not shown) where it will be held by the flux adhesive layer 6 on the under surface of the solder blocks 2, ready for reflow fixing.

Figure 6:
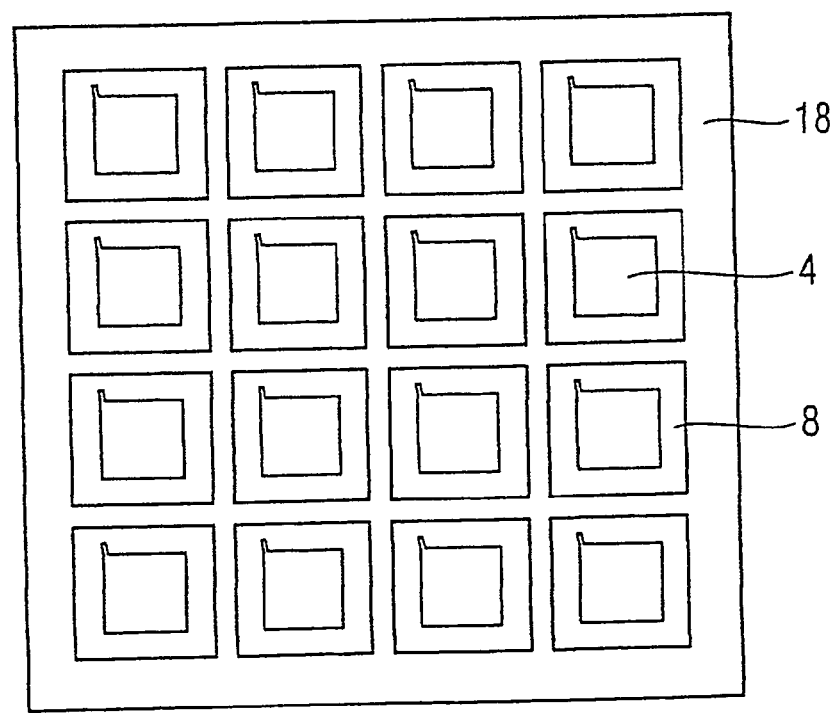
FIG. 6 is a plan view of a sheet containing a plurality of solder block arrays according to an embodiment of the present invention in their carriers.

A plurality of arrays 1 of solder blocks 2 in their carriers 4 may be arranged on a sheet of material 18, as shown in FIG. 6, for convenient storage. The solder block arrays 1 may be detached from the sheet 18 for use, as required.

In practice, to replace or fix a device 12, such as a QFN device, onto a PCB, a suitable solder block array 1 in its carrier 4 is selected to match the land pattern on the (QFN) device 12. The top cover 8 of the carrier 4 is removed, as shown in FIG. 4, and the (QFN) device 12 is then placed in the opening therein, which is shaped to receive it, thereby aligning the array 1 of solder blocks 2 with the land pattern and thermal pad on the device 12, as shown in FIG. 5. The adhesive flux layer 5 on the upper surface of the solder blocks 2 adheres to the contact lands on the device 12. The pick-up head 14 of the re-work system 16 picks up the device 12 together with the solder blocks 2 in the carrier 4, as shown in FIG. 5. The carrier 4, together with the bottom cover 10, is then progressively peeled away from the solder block array 1. Using visual alignment equipment on the re-work system 16, the device 12 is placed in the desired position in a PCB. The device 12 is retained in position by the adhesive flux layer 6 on the bottom surface of the solder blocks 2 in the solder block array 1.

A reflow process melts the solder blocks 2 and the flux film layers 5, 6 when heat is introduced, thereby fixing the device to the printed circuit board in a predefined reflow profile to suit the solder block composition. The profile depends on the composition of the solder blocks 2, which may be tin-lead (SnPb) or lead (Pb) free, although any type of solder may be used. The device is then inspected after the completion of the reflow process to ensure that the positioning of the device 12 is as desired and that the solder joints are sound.

As shown in FIG. 6, a plurality of solder blocks 2 may be arranged on a sheet of material 18. The solder blocks 2 may be detached from the sheet 18 in a manner similar to that of removing an address label from a sheet of labels.

The systems and methods embodying the present invention may be applied to surface mount devices, such as QFN devices, particularly those that conform to the JEDEC Standard of MO220.

In a preferred embodiment, the thickness of the flux film adhesive layers 5, 6 applied to the top and bottom surfaces of the solder blocks 2 is preferably between around 10 to 20 µm. Preferably, the solder blocks 2 have a thickness of between 80 to 100 µm.

Preferred embodiments of the present invention are particularly advantageous over prior art systems that use solder paste printing and mini-stencil techniques. In such prior art systems, it is not generally possible to print on a highly populated PCB land and the manual alignment of manual paste printing requires a high level of skill from the operator. Also, in conventional manual printing techniques, it is difficult to control the thickness consistency of the solder paste. Furthermore, tooling is required in the form of mini stencils and squeegee blades. Such conventional techniques are also time consuming.

One or more preferred embodiments of the invention aim to have better control of the paste thickness and volume than in such prior art techniques, and the alignment of the devices to the pads on the PCB is easier. Also, preferred embodiments of the present invention are much quicker than applying solder paste to a stencil and require much less skill on the part of the operator. Therefore, it is much easier to place the device onto a highly populated PCB as the device is placed in the aligned position using a re-work head rather than manually positioning the device on the PCB.

Various modifications to the embodiments of the present invention described above may be made. Therefore, although the invention has been described above using particular embodiments, many variations are possible within the scope of the claims, as will be clear to the skilled reader, without departing from the spirit and scope of the invention. In particular, whilst a preferred embodiment of the invention has been described with reference to the placement of QFN devices on a PCB, other semiconductor devices may be used.

What is claimed is:

1. A method for attaching a module having an array of contacts arranged in a given pattern to a substrate having an array of contact pads, the method comprising:

applying an array of solder blocks to the array of contacts on the module, the array of solder blocks located in a single aperture in a carrier such that the applying includes aligning the module in the aperture only by dropping the module into the aperture to thereby align the module relative to the array of solder blocks;

positioning the module on the substrate so that the array of solder blocks contacts the array of contact pads on the substrate; and applying heat to reflow the solder blocks to provide mechanical and electrical connection of the module to the substrate.

2. The method according to claim 1, wherein applying an array of solder blocks comprises bringing a first layer of adhesive flux on a first surface of the array of solder blocks into contact with the array of contact pads on the module to adhere the array of solder blocks to the module.

3. The method according to claim 2, wherein the first layer of adhesive flux has a thickness in the range of about 10 to 20 µm.

4. The method according to claim 1, wherein positioning the module on the substrate comprises bringing a second layer of adhesive flux on a second surface of the array of solder blocks into contact with the array of contact pads on the substrate to adhere the array of solder blocks and the module to the substrate.

5. The method according to claim 4, wherein the second layer of adhesive flux has a thickness in the range of about 10 to 20 µm.

6. The method according to claim 1, further comprising removing the carrier after applying the array of solder blocks but before positioning the module on the substrate.

7. The method according to claim 1, wherein applying the array of solder blocks to the array of contacts on the module comprises applying an array of solder blocks located in the aperture in the carrier to the module after removing a cover from the aperture.

8. The method according to claim 1, wherein applying the array of solder blocks to the array of contacts on the module comprises applying an array of solder blocks located in the aperture in the carrier after removing the carrier from a sheet of carriers.

9. The method according to claim 1, wherein the solder blocks each have a thickness in the range of about 80 to 100 µm.

10. The method according to claim 1, wherein the module comprises a semiconductor device and the substrate comprises a printed circuit board.

11. The method according to claim 1, wherein the module comprises a Quad Flatpack Nonlead (QFN) device and the substrate comprises a printed circuit board.

12. The method according to claim 7, wherein the cover comprises a paper cover.

\* \* \* \* \*